United States Patent [19]
Kim et al.

[11] Patent Number: 5,766,970
[45] Date of Patent: Jun. 16, 1998

[54] METHOD OF MANUFACTURING A TWIN WELL SEMICONDUCTOR DEVICE WITH IMPROVED PLANARITY

[75] Inventors: Young-Pil Kim; Tae-Young Chung. both of Kyungki-do. Rep. of Korea

[73] Assignee: Samsung Electronics Co., Ltd.. Suwon. Rep. of Korea

[21] Appl. No.: 22,637

[22] Filed: Feb. 25, 1993

[30] Foreign Application Priority Data

Feb. 25, 1992 [KR] Rep. of Korea .................. 92-2927

[51] Int. Cl.⁶ .................. H01L 21/70; H01L 27/00; H01L 21/302; H01L 21/76
[52] U.S. Cl. .................. 437/57; 437/71
[58] Field of Search .................. 437/71, 940, 69, 437/57, 34; 204/129.3, 129.65

[56] References Cited

U.S. PATENT DOCUMENTS

| | | | |
|---|---|---|---|
| 3,865,654 | 2/1975 | Chang et al. | 437/34 |
| 3,962,052 | 6/1976 | Abbas et al. | 204/129.3 |
| 4,434,543 | 3/1984 | Schwabe et al. | 437/56 |
| 4,435,895 | 3/1984 | Parrillo et al. | 437/56 |
| 4,442,591 | 4/1984 | Haken | 437/56 |
| 4,516,316 | 5/1985 | Haskell | 437/34 |
| 4,525,920 | 7/1985 | Jacobs et al. | 437/57 |
| 4,577,390 | 3/1986 | Haken | 437/56 |
| 4,628,591 | 12/1986 | Zorinsky et al. | 437/71 |
| 4,691,436 | 9/1987 | Hirao | 437/69 |
| 4,761,384 | 8/1988 | Neppl et al. | 437/56 |
| 4,882,289 | 11/1989 | Moriuchi et al. | 437/52 |
| 4,889,825 | 12/1989 | Parrillo | 437/57 |
| 4,929,565 | 5/1990 | Parrillo | 437/57 |
| 5,024,961 | 6/1991 | Lee et al. | 437/57 |
| 5,134,085 | 7/1992 | Gilgen et al. | 437/57 |
| 5,225,365 | 7/1993 | Cosentino | 437/57 |
| 5,554,554 | 9/1996 | Bastani et al. | 437/47 |
| 5,624,857 | 4/1997 | Yang | 437/34 |

FOREIGN PATENT DOCUMENTS

| | | | |
|---|---|---|---|
| 0144149 | 8/1984 | Japan | 437/71 |
| 0202055 | 8/1988 | Japan | 437/56 |
| 0009558 | 1/1991 | Japan | 437/56 |
| 0040463 | 2/1991 | Japan | 437/56 |

*Primary Examiner*—John Niebling
*Attorney, Agent, or Firm*—Cushman Darby & Cushman IP Group of Pillsbury Madison & Sutro LLP

[57] ABSTRACT

A method for manufacturing semiconductor devices having a twin well structure in which the N-well and P-well regions of the substrate receive differential processing to set the final planarity of the semiconductor device. The differential processing permits the relative vertical position of the N-well and P-well surfaces to be controlled as needed to reduce the demands on subsequent processing steps. The relative vertical position of the N-well and P-well surfaces are preferentially set to improve the planarity of the semiconductor device during subsequent manufacturing processes, particularly photolithographic and metallization processes.

1 Claim, 4 Drawing Sheets

CELL PORTION — PERIPHERY

CELL PORTION — PERIPHERY

PERIPHERY — CELL PORTION

CELL PORTION ← → PERIPHERY

METHOD OF MANUFACTURING A TWIN WELL SEMICONDUCTOR DEVICE WITH IMPROVED PLANARITY

FIELD OF THE INVENTION

The present invention relates to a method for manufacturing a CMOS semiconductor device, and more particularly to a method for manufacturing an ULSI semiconductor device having both a memory cell portion and peripheral circuitry portion defined on a twin-well CMOS structure which minimizes the step between the N-well and P-well regions.

BACKGROUND OF THE INVENTION

Prior art methods for manufacturing twin-well CMOS semiconductor devices processes created a step, defined by the vertical distance between the well surfaces, between adjacent N-well and P-well regions. In less highly integrated devices with more liberal design rules and less demanding tolerances, this step did not tend to produce unacceptable processing or reliability complications. However, as the manufactured semiconductor devices became more highly integrated, the production of functional and reliable semiconductor devices became more demanding, particularly in the requirements imposed on the photolithography and metallization processes. In an ULSI dynamic random access memory (DRAM) semiconductor device, the height of the step created between the N-well and P-well regions during conventional well formation can be further exaggerated during the formation of the memory cell capacitor in the P-well region, further complicating subsequent photolithography and metallization processes and increasing the potential for lower device yields or degraded performance and reliability.

Referring to FIGS. 1A–1C and FIG. 2, a typical method for forming the well regions of a conventional twin well CMOS DRAM semiconductor will be explained.

After an oxide film 12 and a nitride film 13 are sequentially formed on a P-type semiconductor substrate 11, the nitride film 13 is removed from the future N-well region using a photolithography process followed by a selective etch process (FIG. 1A). Using the remaining photoresist (not shown) and nitride film 13 as masks for the future P-well region, an N-type impurity, such as arsenic or phosphorous, is ion-implanted into the N-well region of the semiconductor substrate 11. After the N-type implantation, the remaining photoresist (not shown) is removed and a thick oxide film 14, typically having a thickness on the order of 4,000 Å–6,000 Å, is formed on the N-well region through oxidation of a portion of the N-well silicon.

The remaining nitride film 13 is then removed from the future P-well regions of the semiconductor device. A P-type impurity, for example, boron, is ion-implanted through the remaining oxide layer 12 and into the P-well region of the semiconductor substrate 11 (FIG. 1B). The thick oxide 14 which remains in the N-well regions prevents the implantation of the P-type impurity in those regions.

A thermal drive-in process is performed to produce the N-well 15 and P-well 16 through the diffusion of the respective N-type and P-type impurities into the semiconductor substrate 11. After the thermal drive-in process, oxide films 12 and 14 are removed by a wet etch process (FIG. 1C).

In the above-described conventional method for forming the twin well structure, the formation of thick oxide film 14 consumes a portion of the N-well region semiconductor substrate. Because there is no corresponding consumption of the semiconductor substrate in the P-well region, the surface of the N-well region is "lower" than that of adjacent P-well regions. This height difference between the P-well and N-well regions produces a "step" having height "A" as shown in FIG. 1C. In a typical process this step height can be 2000 Å–3000 Å, a difference that is sufficient to affect subsequent photolithography steps.

In addition to the step defined by the difference between the surface of respective N-well and P-well regions, the subsequent formation of the DRAM memory cells and pheripheral (input/output, logic, etc.) circuitry can increase the vertical separation between the surface of the structures formed in the N-well and those structures formed in the P-well. In particular, the formation of, for example, multilayer memory cell capacitor structure 17 further increases the separation between the surface of the P-well structure and that of the peripheral circuitry formed in the N-well (FIG. 2). This increased separation between the surfaces of the respective structures can affect the degree of alignment and focus achievable in subsequent photolithographic processes. In addition to the photolithographic complications, subsequent metallization processes may be affected by metal thinning over the step, resulting in decreased yields and reliability.

SUMMARY OF THE INVENTION

To solve the above problems, it is an object of the present invention to provide a method for manufacturing a semiconductor device with a reduced step height between adjacent N-well and P-well regions.

It is a further object of the present invention is provide a method for manufacturing a semiconductor device which exhibits a reduced vertical separation between the surfaces of memory cell structures and the surfaces of adjacent peripheral circuit structures.

To accomplish these objectives, the present invention provides a method for manufacturing a CMOS semiconductor memory device having a twin well structure in which the P-well is formed before the N-well.

The present invention also provides a method for manufacturing a CMOS semiconductor memory device having a twin well structure in which the post N-type impurity ion-implant N-well region oxide film thickness is limited to 400 Å–600 Å and a photoresist pattern is used to protect the N-well region during the P-type impurity ion-implant to form the P-well.

The present invention also provides a method for manufacturing a CMOS semiconductor memory device having a twin well structure in which the surface of the future P-well region lowered with respect to that of the future N-well region prior to the formation of either of the well regions. This method is characterized in that an oxide film and a nitride film are sequentially formed on a semiconductor substrate, the nitride film is removed from the future P-well region, and the substrate is subjected to an oxidation process to form a thick oxide film is formed on the future P-well region. After oxidation, the remaining nitride film, the oxide film, and the thick oxide film are removed from the substrate, creating a step characterized in that the surface of the future P-well region is lower than the surface of the future N-well region.

The present invention also provides a method for manufacturing a CMOS semiconductor memory device having a twin well structure in which subsequent to the formation of the N-well and P-well regions, the surface of the P-well region is processed to form a porous silicon layer. In a subsequent oxidation process, the difference in oxidation rates between the porous silicon layer in the P-well region and the normal single crystal silicon substrate of the Nwell region increases the thickness of the oxide layer, formed on the P-well portion. After the oxidation process, the oxide layer is removed, producing a twin well structure with a reduced step height between the surfaces of adjacent N-well and P-well regions.

BRIEF DESCRIPTION OF THE DRAWINGS

Further features and advantages will become more apparent from the following, and more particular, description of the preferred embodiments of the invention as illustrated in the accompanying drawings in which the same reference characters generally refer to like parts throughout the views, and in which.

DETAILED DESCRIPTION OF THE INVENTION

Each of the four embodiments of the present invention will be explained in more detail with reference to a corresponding set of Figures.

Figure 3A:
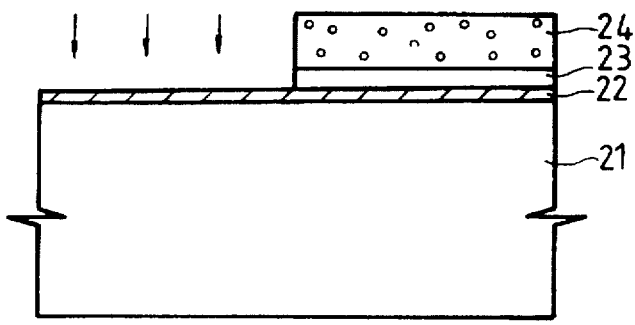
FIGS. 3A–3C show a first embodiment of the present invention.
Figure 3B:
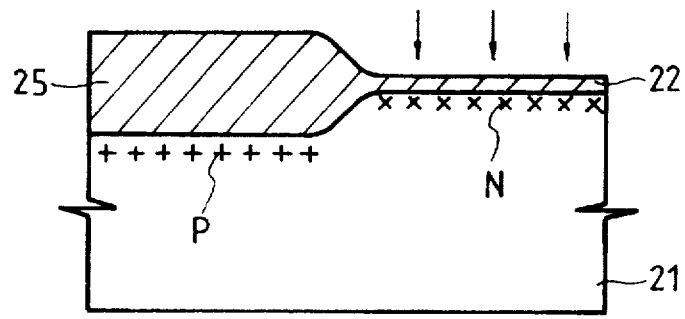
Figure 3C:
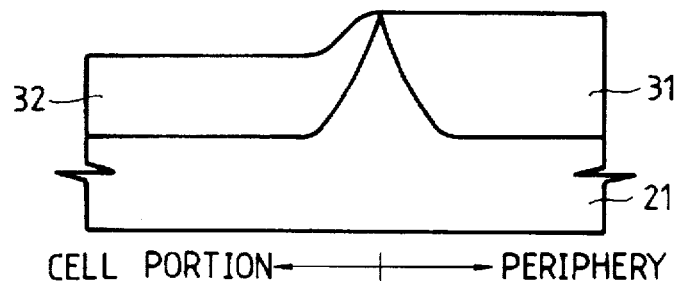

FIGS. 3A–3C show a first embodiment of the present invention. Referring to FIG. 3A, an oxide film 22 and a nitride film 23 are sequentially formed on a semiconductor substrate 21. Then, in contrast to the conventional process, FIGS 1A–1C, all regions of the substrate other than the future P-well region are protected with a photoresist 24. A P-type impurity, for example, boron, is then ion-implanted into the exposed substrate to form the P-well region. After the P-type implant, an oxidation process is utilized to form a thick oxide film on the P-well regions. Due to the tendency of the P-type impurity to be incorporated into the oxide layer during the oxidation process, the P-type impurity implant dose is selected to provide a higher initial dopant concentration than the normal $10^{12} - 10^{13 atoms}/cm^{-2}$ concentration so that the P-well maintains sufficient depth and dopant concentration profile.

Referring to FIG. 3B, after the formation of thick oxide film 25 of 4,000 Å–6,000 Å on the P-well region, the remaining nitride film is removed from the N-well region of the substrate. Using thick oxide film 25 as a mask, the N-type impurity, for example, arsenic or phosphorus, is ion-implanted in the substrate 21 to form the N-well region.

Figure 2:
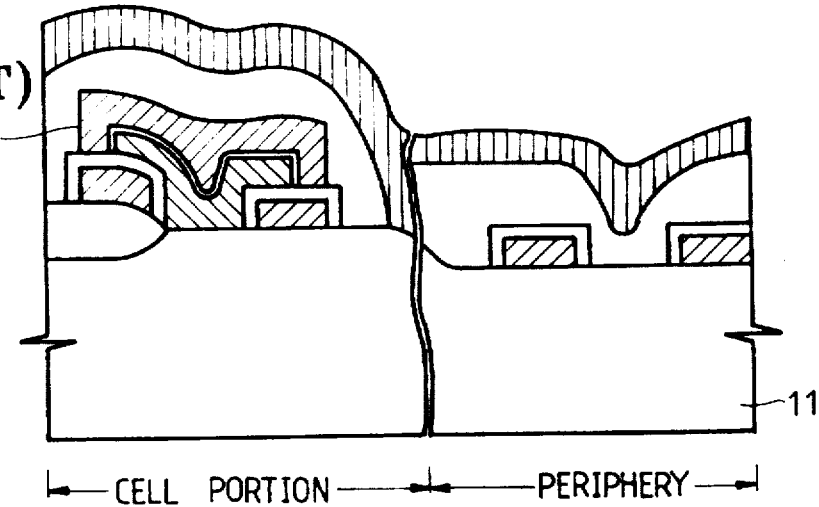
FIG. 2 shows a conventional semiconductor memory device formed on a twin-well structure.

Referring to FIG. 3C, a thermal drive-in process is utilized to form the N-well 31 and P-well 32 by diffusing the impurities into the semiconductor substrate 21. Removing oxide films 22 and 25 reveals a semiconductor substrate in which the surface of the P-well 32 is lower than the surface of an adjacent N-well 31. Given the reversal of the relative heights of the N-well and P-well surfaces, subsequent formation of the memory cell capacitor structures or other devices in the P-well results in a more planar semiconductor structure rather than a structure exhibiting the exaggerated step as shown in FIG. 2.

Figure 4A:
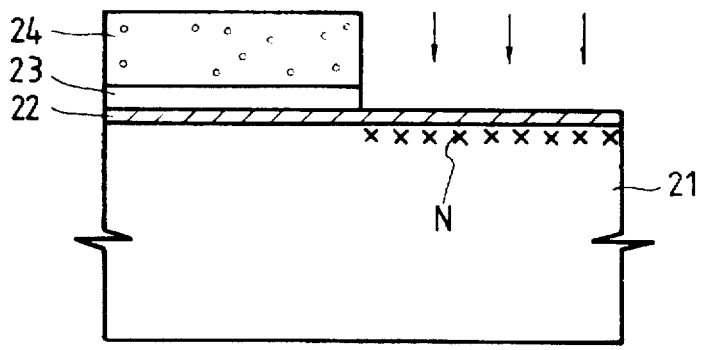
FIGS. 4A–4C show a second embodiment of the present invention.
Figure 4B:
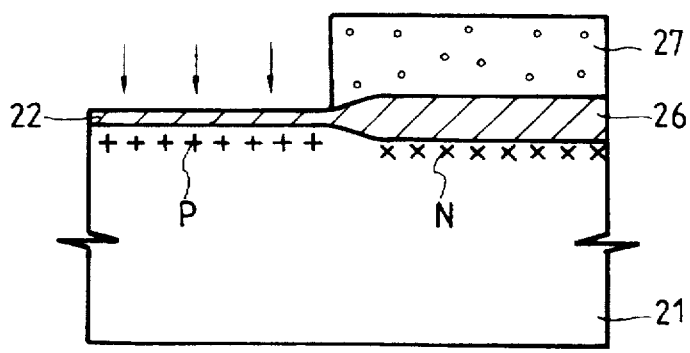
Figure 4C:
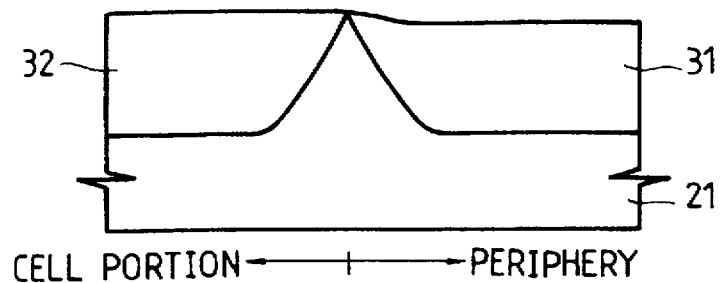

FIGS. 4A–4C show a second embodiment of the present invention. Referring to FIG. 4A, the N-well ion-implantation is first performed with an oxide layer 22, a nitride layer 23, and a photoresist layer 24 protecting the P-well regions from the ion-implant. Referring to FIG. 4B, after the N-well ion-implantation, an oxidation process is used to form a relatively thin oxide film 26 whose thickness is 400 Å–600 Å rather than the thick oxide formed in the conventional process. The remaining nitride film is removed from the P-well region and a photoresist layer 27 is formed to protect the N-well region. Using photoresist layer 27 as an implant mask, a P-type impurity is ion-implanted into the P-well region of the substrate. The 400 Å–600 Å thickness of oxide film 26 is sufficient to permit alignment during subsequent photolithographic processes.

Referring to FIG. 4C, a thermal drive-in process is utilized to form the N-well 31 and P-well 32 by diffusing the ion-implanted impurities into the semiconductor substrate 21. Removing oxide films 22 and 26 reveals a semiconductor substrate in which the surface of the P-well 32 is only slightly higher than the surface of an adjacent N-well 31, resulting in a step height around 200 Å, a reduction of more than 1700 Å from the step height produced by the convention process.

Figure 5A:
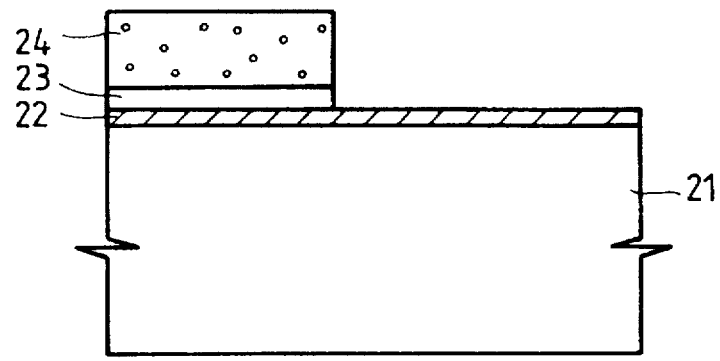
FIGS. 5A–5C show a third embodiment of the present invention.
Figure 5B:
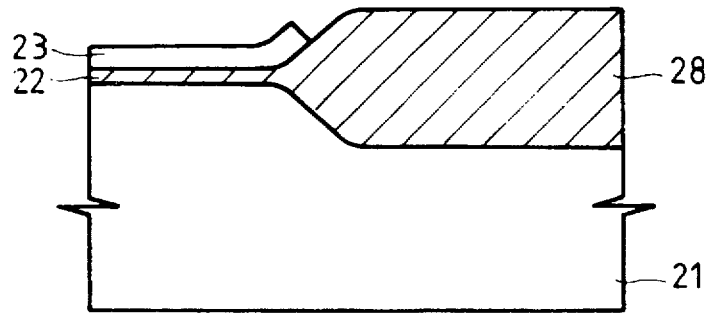
Figure 5C:
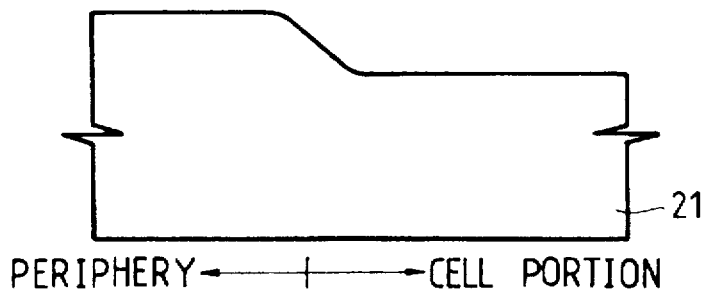

FIGS. 5A–5C show a third embodiment of the present invention. Referring to FIG. 5A, an oxide film 22 and a nitride film 23 are sequentially formed on semiconductor substrate 21. Referring to FIG. 5B, after removing the nitride layer 23 from the future P-well region, the substrate is oxidized to form a thick oxide film 28 in the P-well region.

Referring to FIG. 5C, removing the remaining nitride film 23 and oxide film 22 from the future N-well region and removing oxide film 28 from the future P-well region produces a substrate 21 exhibiting a step structure in which the surface of the future P-well region is lower than the surface of an adjacent future N-well region. Because of the direct relation between the thickness of oxide film 28 and the resulting step height, modification of the oxidation process can be used to produce a range of step heights.

Figure 1A:
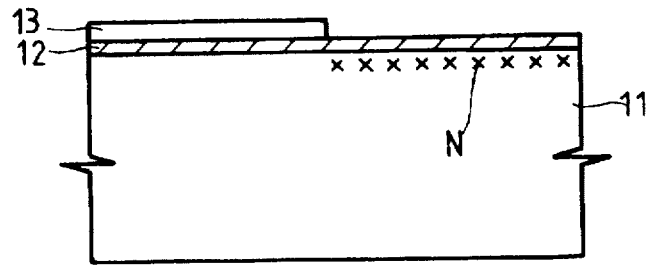
FIGS. 1A–1C show a conventional method of forming a twin-well structure.
Figure 1B:
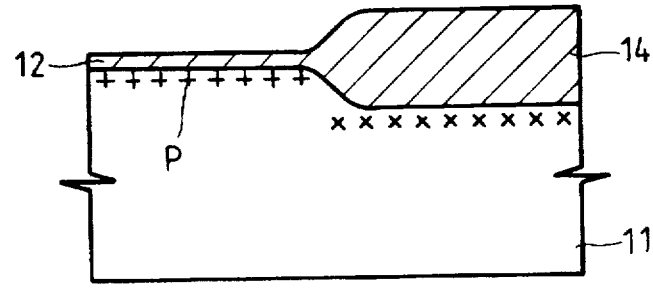
Figure 1C:
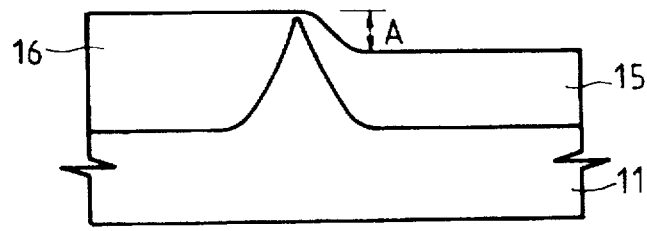
Figure 6A:
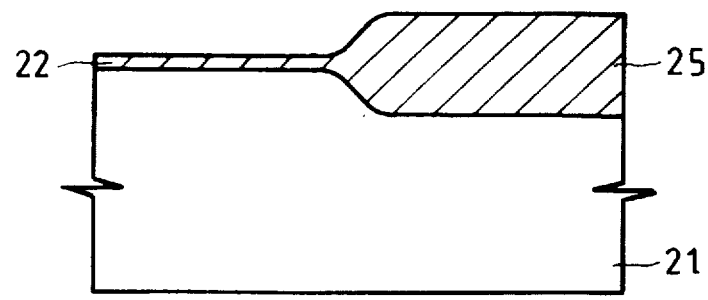
FIGS. 6A–6D show a fourth embodiment of the present invention.

FIGS. 6A–6D show a fourth embodiment of the present invention. Referring to FIG. 6A, the N-well and the P-well (not shown) are formed by the conventional method, as previously described and as shown in FIGS. 1A–1C, producing a relatively thick, 4000 Å–6000 Å, oxide 25 in the N-well region and a relatively thin oxide 22 in the P-well region as illustrated in FIG. 1B.

Figure 6B:
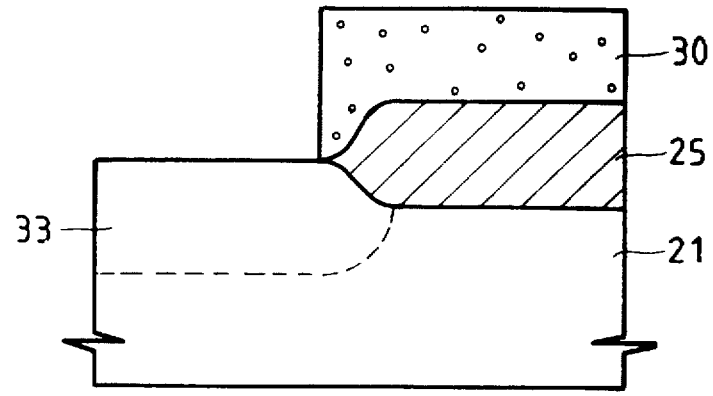

Referring to FIG. 6B, a photoresist layer 30 is applied to oxide film 25 depicted in FIG. 6A to further protect the N-well region from the subsequent processing. The P-well region silicon is then anodic-oxidized in a 50% HF solution so as to form a porous silicon layer 33. The method of forming porous silicon is described in detail in *J. Electrochem. Soc.*, Vol. 125, No. 8, pp. 1339–1343. The porous silicon, which comprises silicon exhibiting minute, randomly distributed pores, results from the partial vertical decomposition of the P-well region substrate as a result of the anodic-oxidation.

Figure 6C:
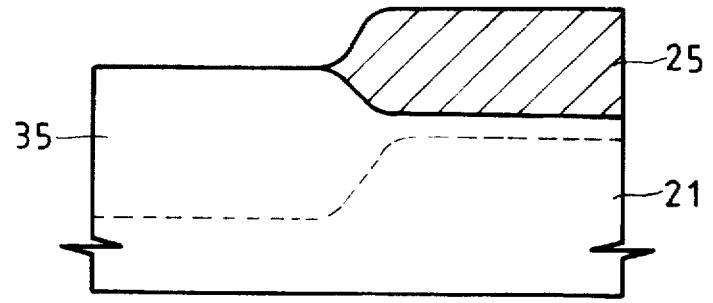
Figure 6D:
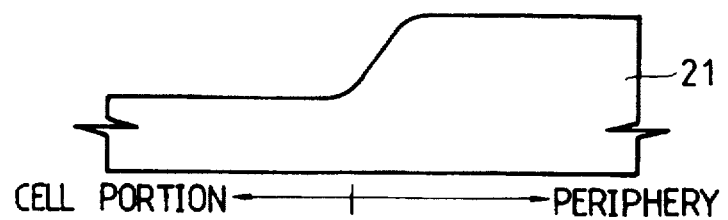

Referring to FIG. 6C, a subsequent oxidation process produces an oxide film 35 which results from the oxidation of both the porous silicon layer 33 and a portion of the single crystal silicon underlying both the porous silicon and thick oxide 25. Because porous silicon oxidizes 10–20 times as fast as the single crystal silicon, the oxide film 35 is much thicker in the P-well region than in the N-well region. Removing oxide films 25 and 35, as shown in FIG. 6D, reveals a semiconductor substrate 21 in which the surface of the P-well region is lower than the surface of an adjacent N-well region. Given the reversal of the relative heights of the N-well region and P-well region surfaces, subsequent formation of circuit structures, such as memory cell capacitor structures, in the P-well results in a more planar semiconductor structure rather than a structure exhibiting the exaggerated step as shown in FIG. 2. Because of the direct relation between the thickness of porous silicon layer 33 and the resulting step height, modification of the anodic-oxidation process can be used to produce a range of step heights and reduce the occurrence of oxidation defects in the silicon substrate.

As described above, the present invention permits control of the step between adjacent alternately doped well regions, thereby decreasing the demands on subsequent photolithography and metallization processes. The present invention, when utilized in the manufacture of ULSI DRAM devices or other demanding semiconductor products can improve process yield and device reliability.

Having described a preferred embodiment of the present invention, it will be clear to those skilled in the art that modifications and alternatives to the disclosed device exist within the scope and spirit of the present invention. Accordingly, it is intended to limit the scope of the present invention only as indicated in the following claims.

What is claimed is:

1. A method of manufacturing a generally planar semiconductor device structure, said device structure comprising a twin well structure, said twin well structure having at least a P-well structure and N-well structure adjacently disposed in a semiconductor substrate, said method comprising the steps of:

forming a porous silicon layer in said P-well structure;

oxidizing said porous silicon layer to produce an oxide layer; and removing said oxide layer.

\* \* \* \* \*